US010564194B2

(12) United States Patent
Yau

(10) Patent No.: US 10,564,194 B2
(45) Date of Patent: Feb. 18, 2020

(54) METHOD AND SYSTEM FOR IDENTIFYING ENERGY CONSUMPTION OF ELECTRICAL APPLIANCE

(71) Applicant: Delight Innovative Technologies Limited, Hong Kong (CN)

(72) Inventor: Kin Hing Yau, Hong Kong (CN)

(73) Assignee: Delight Innovative Technologies Limited, Hong Kong (CN)

( * ) Notice: Subject to any disclaimer, the term of this patent is extended or adjusted under 35 U.S.C. 154(b) by 59 days.

(21) Appl. No.: 15/768,333

(22) PCT Filed: Oct. 17, 2016

(86) PCT No.: PCT/CN2016/102285
§ 371 (c)(1),
(2) Date: Apr. 13, 2018

(87) PCT Pub. No.: WO2017/063607
PCT Pub. Date: Apr. 20, 2017

(65) Prior Publication Data
US 2018/0321289 A1 Nov. 8, 2018

(30) Foreign Application Priority Data
Oct. 16, 2015 (CN) .......................... 2015 1 0674484

(51) Int. Cl.
*G01R 22/06* (2006.01)
*G01R 21/06* (2006.01)
(52) U.S. Cl.
CPC ............. *G01R 22/06* (2013.01); *G01R 21/06* (2013.01)
(58) Field of Classification Search
CPC .. G01R 22/06; G01R 21/133; G01R 21/1336; G01R 21/06; H02J 13/00; H02J 13/0006;
(Continued)

(56) References Cited

U.S. PATENT DOCUMENTS 6,487,509 B1 * 11/2002 Aisa .......................... H02J 3/14
702/60
9,217,764 B2 * 12/2015 Heintz ...................... H02J 3/14
(Continued)

FOREIGN PATENT DOCUMENTS

CN 101610005 A 12/2009
CN 101800439 A 8/2010
(Continued)

OTHER PUBLICATIONS

International Search Report from PCT Application No. PCT/CN2016/102285 including its English-language translation, which is the parent application to the instant application; dated Jan. 18, 2017, 8 pages.

(Continued)

*Primary Examiner* — Son T Le
(74) *Attorney, Agent, or Firm* — Harness, Dickey & Pierce, P.L.C.; Anthony G. Fussner

(57) ABSTRACT

The present invention relates to a method and a system for identifying energy consumption of electrical appliances. The method uses a string current controller to connect one or more strings of terminal controller string group, wherein each string of terminal controller string group includes one or more terminal controllers connected in series according to priority and each terminal controller is connected to a group of electrical appliances, the string current controller controls, via commands, the power of every terminal controller that are turned on in order of priority in the terminal controller string group, and detects and records the power value, and compares the power value with the rated power of the string current controller, thus, the power of each terminal controller can be monitored and identified in real time to identify and alarm the energy consumption, thereby (Continued)

improving the safety and reliability of the use of electrical appliances.

20 Claims, 2 Drawing Sheets

(58) Field of Classification Search
CPC ........ H02J 3/14; H04L 12/2823; H04L 9/006; H04L 9/32; H04L 9/3272
See application file for complete search history.

(56) References Cited

U.S. PATENT DOCUMENTS

| | | | |
|---|---|---|---|
| 10,191,095 B2* | 1/2019 | Gagnon | G01R 21/133 |
| 2005/0222784 A1* | 10/2005 | Tuff | G01D 4/008 |
| | | | 702/61 |
| 2011/0254382 A1 | 10/2011 | Melendez et al. | |
| 2013/0010335 A1* | 1/2013 | Baba | G03G 15/5004 |
| | | | 358/3.01 |
| 2014/0129004 A1* | 5/2014 | Takayama | G05B 15/02 |
| | | | 700/83 |
| 2016/0081127 A1* | 3/2016 | Lee | H04W 76/10 |
| | | | 709/228 |

FOREIGN PATENT DOCUMENTS

| | | |
|---|---|---|
| CN | 102236331 A | 11/2011 |
| CN | 102854379 A | 1/2013 |
| CN | 102854847 A | 1/2013 |
| CN | 204462825 U | 7/2015 |
| JP | H11178247 A | 7/1999 |
| JP | 2011114355 A | 6/2011 |

OTHER PUBLICATIONS

Written Opinion stating all claims are patentable from PCT Application No. PCT/CN2016/102285 which is the parent application to the instant application; dated Jan. 18, 2017, 3 pages.

* cited by examiner

METHOD AND SYSTEM FOR IDENTIFYING ENERGY CONSUMPTION OF ELECTRICAL APPLIANCE

This patent application is a U.S. national stage filing under 35 U.S.C. § 371 of International Application No. PCT/CN2016/102285 filed Oct. 17, 2016 (published as WO 2017/063607 on Apr. 20, 2017), which claims priority of Chinese application No. 201510674484.2 filed Oct. 16, 2015. The disclosures of the applications identified in this paragraph are incorporated herein by reference in their entirety.

TECHNICAL FIELD

The present invention relates to the technical field of energy consumption monitoring, and in particular to a method and a system for identifying energy consumption of electrical appliances.

BACKGROUND TECHNIQUE

At present, the use of electrical appliances, especially indoor appliances, has become very popular. In particular, the installation and use of indoor lighting control systems (such as LED lighting control system) for rendering special scenes is particularly popular. However, unfortunately, the use of a large number of electrical appliances has led to a significant increase in energy consumption, at the same time, it has not been able to know which electrical appliances are mainly responsible for the large increase in energy consumption, and at what time period the large increase in energy consumption is caused. Therefore, it requires expensive professional manpower and takes a lot of manpower and capital costs to replace the arrangement of energy-saving appliances.

SUMMARY OF THE INVENTION

The invention aims at the problem that the energy consumption of the electrical appliances cannot be monitored and identified in the prior arts, and a method for identifying energy consumption of electrical appliances is proposed, a string current controller is used to connect one or more strings of terminal controller string group, the string current controller controls, via commands, the power of every terminal controller that are turned on in order of priority in the terminal controller string group, and detects and records the power value, and compares the power value with the rated power of the string current controller. Thus, the power of each terminal controller can be monitored and identified in real time to identify and alarm the energy consumption, thereby improving the safety and reliability of the use of electrical appliances.

The technical solution of the present invention is as follows:

A method for identifying energy consumption of electrical appliances is characterized in that the method includes following steps:

1) A string current controller is used to connect one or more strings of terminal controller string group, wherein each string of terminal controller string group includes one or more terminal controllers connected in series according to priority and each terminal controller is connected to a group of electrical appliances;

2) The string current controller sends an identity authentication command to each string of terminal controller string group, every terminal controller in each string of terminal controller string group sequentially receives the identity authentication command in descending order of priority levels, and forwards the identity authentication command to a next-level terminal controller in turn; each terminal controller then reports an identity information by level from low to high according to the priority level, and eventually the string current controller receives the identity information;

3) The string current controller sends an action command to turn off all the terminal controllers, detects a current of the string current controller at this time, and defines and records a power at this time as a target power;

4) The string current controller sends an action command to turn on the terminal controller with the highest priority in the terminal controller string group and controls it to work with minimum power, detects a current of the string current controller at this time, and defines and records a power at this time as the lowest power of the terminal controller with the highest priority; the string current controller controls an operating power of the terminal controller with the highest priority to sequentially increase, and detects the current of the string current controller, and records the power until the string current controller is overloaded and/or the power of the terminal controller with the highest priority has reached the maximum power; above recorded power is added to a load power of the group of electrical appliances connected to the highest priority terminal controller to generate and record a total power at that time, if the total power value at this time is greater than the rated power of the string current controller, an alarm is issued, if the total power value at this time is less than the rated power of the string current controller, the string current controller sends an action command to turn on the terminal controller with the second priority in the terminal controller string group and controls it to work at the minimum power, above detection process is repeated until all the terminal controllers are turned on and have been detected.

When increasing the number of terminal controllers in the terminal controller string group, the newly added terminal controller is connected to the terminal controller with the lowest priority in the terminal controller string group, and the newly added terminal controller becomes the lowest priority terminal controller, the newly added terminal controller actively reports its identity information to the string current controller or reports its identity information when the string current controller issues an identity authentication command.

When reducing the number of terminal controllers in the terminal controller string group, if the terminal controller to be removed has the lowest priority, the terminal controller will be removed directly, and the terminal controller having a priority one level higher than that of the terminal controller to be removed becomes the terminal controller having the lowest priority, otherwise, if the terminal controller to be removed does not has the lowest priority, after removing the terminal controller to be removed, the priority of the terminal controller whose priority is lower than that of the terminal controller to be removed is in turn increased.

In the step 4), after the alarm is generated because the total power value at this time is greater than the rated power of the string current controller, the string current controller sends an action command to reduce the operating power of the terminal controller being detected; or the string current controller sends an action command to turn off the terminal controller being detected; or the string current controller adjusts the rated power of the string current controller.

The string current controller is connected to terminals via a network for remote control.

In the step 2), the identity information includes product model, product unique number, date of manufacture, address information and electrical load information; and/or, in step 3), the action commands include turning off, turning on and shifting; and/or, the terminal controller actively sends the terminal controller's own command set to the string current controller to assist the string current controller in sending commands.

The string current controllers are more than one adjacent string current controllers which are connected to each other, each string current controller is connected to one or more strings of terminal controller string group, each string of terminal controller string group includes one or more terminal controllers and each terminal controller is connected to a group of electrical appliances.

The more than one string current controllers share a common power supply and coordinate the distribution of the total rated power.

A system for identifying energy consumption of electrical appliances is characterized in that it includes a string current controller, terminal controllers and a detector;

the string current controller is connected to a power supply and the detector at the same time;

the string current controller is connected to one or more strings of terminal controller string group, wherein each string of terminal controller string group includes one or more terminal controllers connected in series according to priority and each terminal controller is connected to a group of electrical appliances;

the string current controller sends an identity authentication command to each string of terminal controller string group, every terminal controller in each string of terminal controller string group sequentially receives the identity authentication command in descending order of priority levels, and forwards the identity authentication command to a next-level terminal controller in turn, each terminal controller then reports an identity information by level from low to high according to the priority level, and eventually the string current controller receives the identity information;

the string current controller sends an action command to turn off all the terminal controllers, detects a current of the string current controller at this time, and defines and records a power at this time as a target power;

the string current controller sends an action command to turn on the terminal controller with the highest priority in the terminal controller string group and controls it to work with minimum power, detects a current of the string current controller at this time, and defines and records a power at this time as the lowest power of the terminal controller with the highest priority; the string current controller controls an operating power of the terminal controller with the highest priority to sequentially increase, and detects the current of the string current controller, and records the power until the string current controller is overloaded and/or the power of the terminal controller with the highest priority has reached the maximum power; above recorded power is added to a load power of the group of electrical appliances connected to the highest priority terminal controller to generate and record the total power at that time, if the total power value at this time is greater than the rated power of the string current controller, an alarm is issued, if the total power value at this time is less than the rated power of the string current controller, the string current controller sends an action command to turn on the terminal controller with the second priority in the terminal controller string group and controls it to work at the minimum power, above detection process is repeated until all the terminal controllers are turned on and have been detected.

The system for identifying energy consumption of electrical appliances further includes an antenna, the string current controller is connected to the antenna so as to connect the terminals via the network for remote control.

The string current controllers are more than one adjacent string current controllers which are connected to each other, each string current controller is connected to one or more strings of terminal controller string group, each string of terminal controller string group includes one or more terminal controllers and each terminal controller is connected to a group of electrical appliances.

The technical effects of the present invention are as follows:

The present invention relates to a method for identifying energy consumption of electrical appliances. A string current controller is used to connect one or more strings of terminal controller string group, wherein each string of terminal controller string group may includes one or more terminal controllers connected in series according to priority and each terminal controller is connected to a group of electrical appliances, the string current controller controls, via commands, the power of every terminal controller that are turned on in order of priority in the terminal controller string group, and detects and records the power value, and compares the power value with the rated power of the string current controller, thus, the power of each terminal controller can be monitored and identified in real time to identify and alarm the energy consumption, thereby improving the safety and reliability of the use of electrical appliances.

The present invention further relates to a system for identifying energy consumption of electrical appliances, the system corresponds to the above-described method for identifying energy consumption of electrical appliances, the system uses a string current controller to connect the power supply and the detector at the same time; the string current controller is connected to one or more strings of terminal controller string group, wherein each string of terminal controller strings includes one or more terminal controllers connected in series according to priority and each terminal controller is connected to a group of electrical appliances, thus, the power of each terminal controller can be monitored and identified in real time to identify and alarm the energy consumption, thereby improving the safety and reliability of the use of electrical appliances.

The reference numbers in the figures are listed as follows:
1—string current controller; 2—terminal controller; 3—power supply; 4—detector; 5—antenna.

DETAILED DESCRIPTION OF THE PREFERRED EMBODIMENTS

The present invention will be described below with reference to the accompanying drawings.

Figure 1:
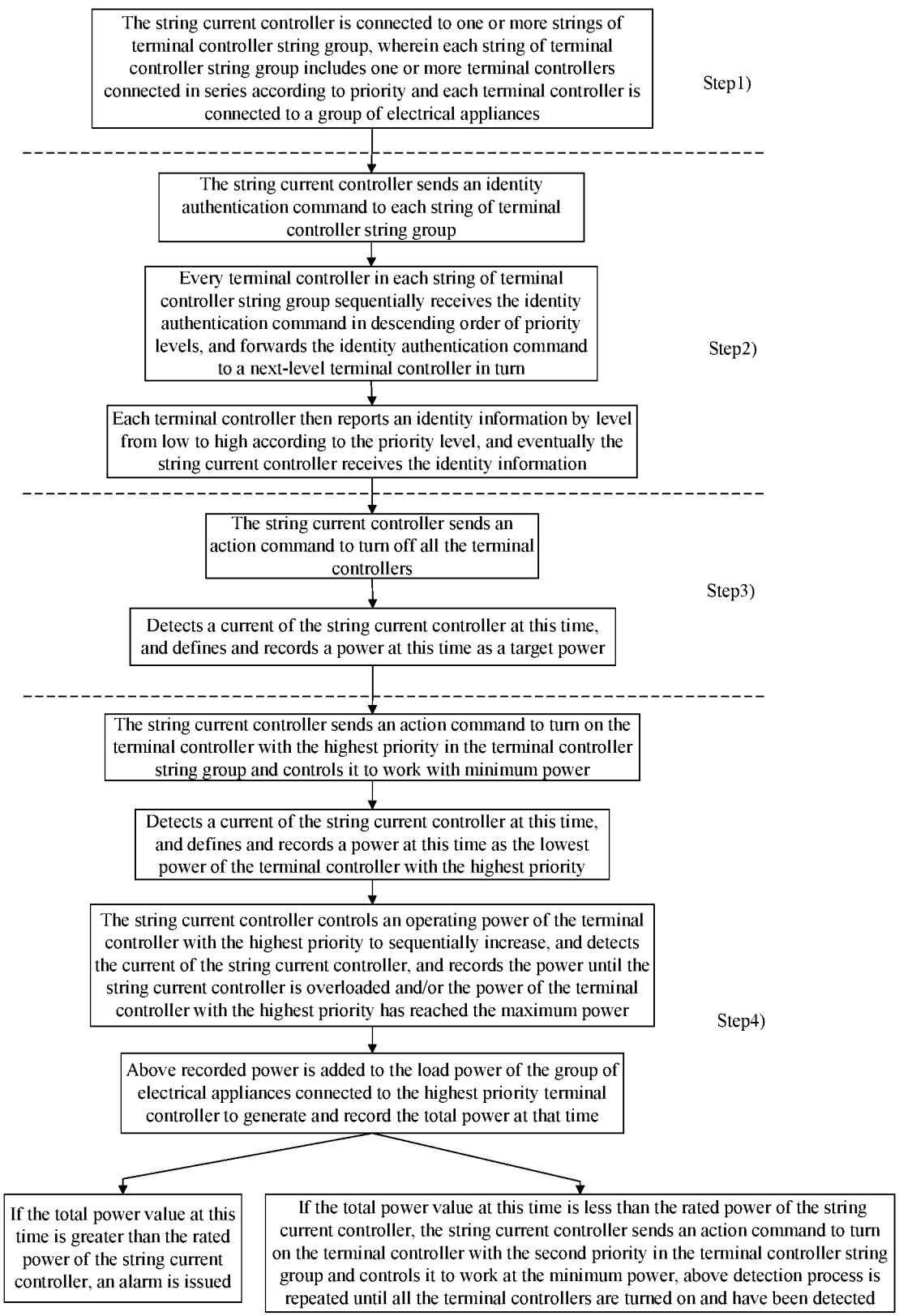
FIG. 1 is a flow chart of a method for identifying energy consumption of electric appliances according to the present invention.
Figure 2:
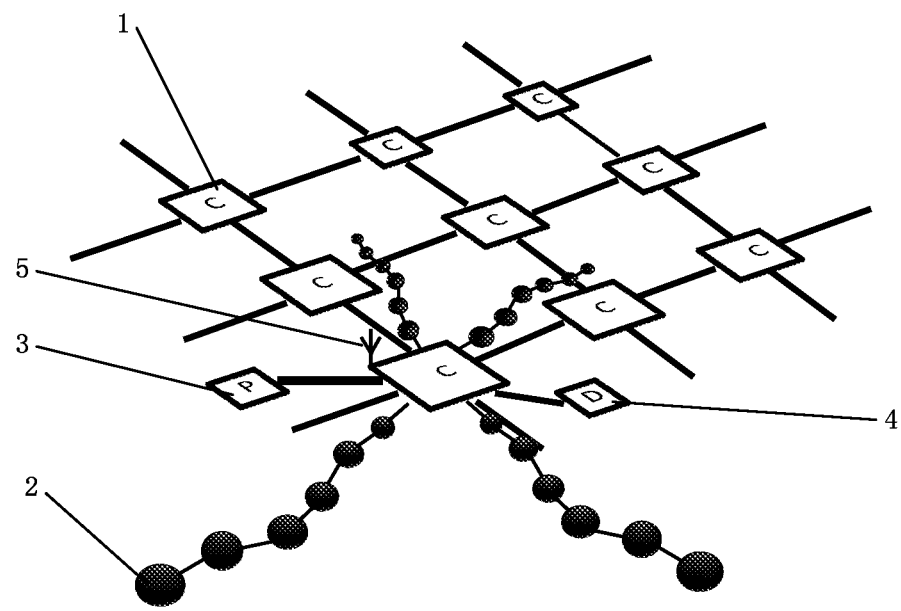
FIG. 2 is a schematic diagram of a structure of identification of energy consumption of electrical appliances according to the present invention.

FIG. 1 is a flow chart of a method for identifying energy consumption of electrical appliances according to the present invention, FIG. 2 is a schematic structural diagram of identification of energy consumption of electrical appliances in for example a practical application, as shown in FIG. 1, the following steps are included:

1) A string current controller is used to connect one or more strings of terminal controller string group, wherein each string of terminal controller string group includes one or more terminal controllers connected in series according to priority and each terminal controller is connected to a group of electrical appliances; and wherein the string current controller used may be hardware devices such as a central controller etc.;

2) The string current controller sends an identity authentication command to each string of terminal controller string group. Every terminal controller in each string of terminal controller string group sequentially receives the identity authentication command in descending order of priority levels, and forwards the identity authentication command to the next-level terminal controller in turn; each terminal controller then reports the identity information by level from low to high according to the priority level, and eventually the string current controller receives the identity information; above identity information may include product model, product unique number, date of manufacture, address information and electrical load information;

3) The string current controller sends an action command to turn off all the terminal controllers, detects the current of the string current controller at this time, and defines and records the power at this time as the target power;

4) The string current controller sends an action command to turn on the terminal controller with the highest priority in the terminal controller string and controls it to work with minimum power, detects the current of the string current controller at this time, and defines and records the power at this time as the lowest power of the terminal controller with the highest priority; the string current controller controls an operating power of the terminal controller with the highest priority to sequentially increase, and detects the current of the string current controller, and records the power until the string current controller is overloaded and/or the power of the terminal controller with the highest priority has reached the maximum power; above recorded power is added to the load power of the group of electrical appliances connected to the highest priority terminal controller to generate and record a total power at that time. If the total power value at this time is greater than the rated power of the string current controller, an alarm is issued. If the total power value at this time is less than the rated power of the string current controller, the string current controller sends an action command to turn on the terminal controller with the second priority in the terminal controller string group and controls it to work at the minimum power. Above detection process is repeated until all the terminal controllers are turned on and have been detected.

Preferably, above action commands may include turning off, turning on and shifting; the terminal controller can also actively send the terminal controller's own command set to the string current controller to assist the string current controller in sending commands.

When increasing the number of terminal controllers in the terminal controller string group, the newly added terminal controller is connected to the terminal controller with the lowest priority in the terminal controller string group, and the newly added terminal controller becomes the lowest priority terminal controller, the newly added terminal controller actively reports its identity information to the string current controller or reports its identity information when the string current controller issues an identity authentication command; when reducing the number of terminal controllers in the terminal controller string group, if the terminal controller to be removed has the lowest priority, the terminal controller will be removed directly, and the terminal controller having a priority one level higher than that of the terminal controller to be removed becomes the terminal controller having the lowest priority, otherwise, if the terminal controller to be removed does not has the lowest priority, after removing the terminal controller to be removed, the priority of the terminal controller whose priority is lower than that of the terminal controller to be removed is in turn increased.

Preferably, after the alarm is generated because the total power value being detected is greater than the rated power of the string current controller, the string current controller may choose to send an action instruction to reduce the operating power of the terminal controller being detected and record the event for backup or for future application reference; or the string current controller may choose to send an action instruction to turn off the terminal controller being detected and record the event for backup or for future application reference; or the string current controller can choose to adjust the rated power of the string current controller and to record the event for backup or for future application reference.

Preferably, the string current controller is connected to terminals via a network for remote control.

More preferably, the string current controllers may be more than one adjacent string current controllers which are connected to each other, each string current controller is connected to one or more strings of terminal controller string group, each string of terminal controller strings includes one or more terminal controllers and each terminal controller is connected to a group of electrical appliances, a this point, the more than one string current controllers can share a common power supply and coordinate the distribution of the total rated power.

Figure 3:
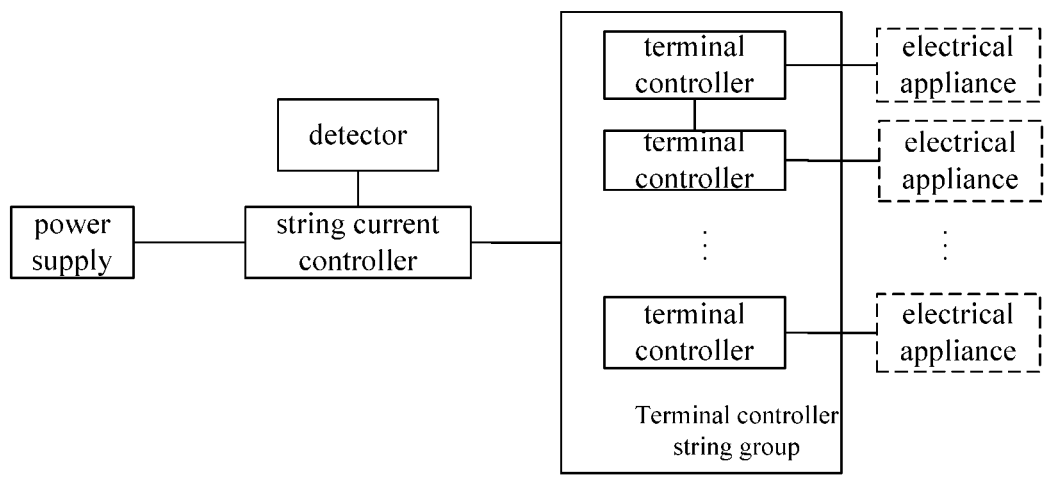
FIG. 3 is a schematic diagram of a structure of a system for identifying energy consumption of electrical appliances according to the present invention.

The present invention further relates to a system for identifying energy consumption of electrical appliances, the system corresponds to above-described method for identifying energy consumption of electrical appliances. It can also be understood that the system is a system that implements above method. The structure of the system is shown in FIG. 3, it includes a string current controller, terminal controllers and a detector; the string current controller is connected to the power supply and the detector at the same time; the string current controller is connected to one or more strings of terminal controller string group, wherein each string of terminal controller string group includes one or more terminal controllers connected in series according to priority and each terminal controller is connected to a group of electrical appliances.

The string current controller sends an identity authentication command to each string of terminal controller string group, every terminal controller in each string of terminal controller string group sequentially receives the identity authentication command in descending order of priority levels, and forwards the identity authentication command to a next-level terminal controller in turn, each terminal controller then reports an identity information by level from low to high according to the priority level, and eventually the string current controller receives the identity information;

The string current controller sends an action command to turn off all the terminal controllers, detects the current of the string current controller at this time, and defines and records a power at this time as the target power;

The string current controller sends an action command to turn on the terminal controller with the highest priority in the terminal controller string group and controls it to work with minimum power, detects the current of the string current controller at this time, and defines and records a power at this time as the lowest power of the terminal controller with the highest priority; the string current controller controls an operating power of the terminal controller with the highest priority to sequentially increase, and detects the current of the string current controller, and records the power until the string current controller is overloaded and/or the power of the terminal controller with the highest priority has reached the maximum power; above recorded power is added to the load power of the group of electrical appliances connected to the highest priority terminal controller to generate and record the total power at that time, if the total power value at this time is greater than the rated power of the string current controller, an alarm is issued, if the total power value at this time is less than the rated power of the string current controller, the string current controller sends an action command to turn on the terminal controller with the second priority in the terminal controller string group and controls it to work at the minimum power, above detection process is repeated until all the terminal controllers are turned on and have been detected.

Preferably, the system for identifying energy consumption of electrical appliances further includes an antenna, the string current controller is connected to the antenna so as to connect the terminals via the network for remote control.

More preferably, the string current controllers may be more than one adjacent string current controllers which are connected to each other, each string current controller is connected to one or more strings of terminal controller string group, each string of terminal controller string group includes one or more terminal controllers and each terminal controller is connected to a group of electrical appliances.

It should be noted that the above-described embodiments may make those skilled in the art more fully understand the invention, but do not limit the invention in any way. Therefore, although the present specification has been described in detail with reference to the accompanying drawings and embodiments, it should be understood by those skilled in the art that the invention can still be modified or equivalently replaced. In short, all technical solutions and improvements that do not deviate from the spirit and scope of the present invention shall all be covered by the protection scope of the present patent.

The invention claimed is:

1. A method for identifying energy consumption of electrical appliances, comprising following steps:
   a) a string current controller is used to connect one or more strings of terminal controller string group, wherein each string of terminal controller string group includes one or more terminal controllers connected in series according to priority and each terminal controller is connected to a group of electrical appliances;
   b) the string current controller sends an identity authentication command to each string of terminal controller string group, every terminal controller in each string of terminal controller string group sequentially receives the identity authentication command in descending order of priority levels, and forwards the identity authentication command to a next-level terminal controller in turn; each terminal controller then reports an identity information by level from low to high according to the priority level, and eventually the string current controller receives the identity information;
   c) the string current controller sends an action command to turn off all the terminal controllers, detects a current of the string current controller at this time, and defines and records a power at this time as a target power;
   d) the string current controller sends an action command to turn on the terminal controller with the highest priority in the terminal controller string group and controls it to work with minimum power, detects a current of the string current controller at this time, and defines and records a power at this time as the lowest power of the terminal controller with the highest priority; the string current controller controls an operating power of the terminal controller with the highest priority to sequentially increase, and detects the current of the string current controller, and records the power until the string current controller is overloaded and/or the power of the terminal controller with the highest priority has reached the maximum power; above recorded power is added to a load power of the group of electrical appliances connected to the highest priority terminal controller to generate and record a total power at that time, if the total power value at this time is greater than the rated power of the string current controller, an alarm is issued, if the total power value at this time is less than the rated power of the string current controller, the string current controller sends an action command to turn on the terminal controller with the second priority in the terminal controller string group and controls it to work at the minimum power, above detection process is repeated until all the terminal controllers are turned on and have been detected.

2. The method for identifying energy consumption of electrical appliances according to claim 1, wherein when increasing the number of terminal controllers in the terminal controller string group, the newly added terminal controller is connected to the terminal controller with the lowest priority in the terminal controller string group, and the newly added terminal controller becomes the lowest priority terminal controller, the newly added terminal controller actively reports its identity information to the string current controller or reports its identity information when the string current controller issues an identity authentication command.

3. The method for identifying energy consumption of electrical appliances according to claim 1, wherein when reducing the number of terminal controllers in the terminal controller string group, if the terminal controller to be removed has the lowest priority, the terminal controller will be removed directly, and the terminal controller having a priority one level higher than that of the terminal controller to be removed becomes the terminal controller having the lowest priority, otherwise, if the terminal controller to be removed does not has the lowest priority, after removing the terminal controller to be removed, the priority of the terminal controller whose priority is lower than that of the terminal controller to be removed is in turn increased.

4. The method for identifying energy consumption of electrical appliances according to claim 1, wherein after the alarm is generated because the total power value at this time is greater than the rated power of the string current controller in the step d), the string current controller sends an action command to reduce the operating power of the terminal controller being detected; or the string current controller sends an action command to turn off the terminal controller being detected; or the string current controller adjusts the rated power of the string current controller.

5. The method for identifying energy consumption of electrical appliances according to claim 4, wherein the string current controller is connected to terminals via a network for remote control.

6. The method for identifying energy consumption of electrical appliances according to claim 1, wherein the identity information in the step b) includes product model, product unique number, date of manufacture, address information and electrical load information; and/or, in step c), the action commands include turning off, turning on and shifting; and/or, the terminal controller actively sends the terminal controller's own command set to the string current controller to assist the string current controller in sending commands.

7. The method for identifying energy consumption of electrical appliances according to claim 1, wherein the string current controllers are more than one adjacent string current controllers which are connected to each other, each string current controller is connected to one or more strings of terminal controller string group, each string of terminal controller string group includes one or more terminal controllers and each terminal controller is connected to a group of electrical appliances.

8. The method for identifying energy consumption of electrical appliances according to claim 7, wherein the more than one string current controllers share a common power supply and coordinate the distribution of the total rated power.

9. The method for identifying energy consumption of electrical appliances according to claim 2, wherein the string current controllers are more than one adjacent string current controllers which are connected to each other, each string current controller is connected to one or more strings of terminal controller string group, each string of terminal controller string group includes one or more terminal controllers and each terminal controller is connected to a group of electrical appliances.

10. The method for identifying energy consumption of electrical appliances according to claim 9, wherein the more than one string current controllers share a common power supply and coordinate the distribution of the total rated power.

11. The method for identifying energy consumption of electrical appliances according to claim 3, wherein the string current controllers are more than one adjacent string current controllers which are connected to each other, each string current controller is connected to one or more strings of terminal controller string group, each string of terminal controller string group includes one or more terminal controllers and each terminal controller is connected to a group of electrical appliances.

12. The method for identifying energy consumption of electrical appliances according to claim 11, wherein the more than one string current controllers share a common power supply and coordinate the distribution of the total rated power.

13. The method for identifying energy consumption of electrical appliances according to claim 4, wherein the string current controllers are more than one adjacent string current controllers which are connected to each other, each string current controller is connected to one or more strings of terminal controller string group, each string of terminal controller string group includes one or more terminal controllers and each terminal controller is connected to a group of electrical appliances.

14. The method for identifying energy consumption of electrical appliances according to claim 13, wherein the more than one string current controllers share a common power supply and coordinate the distribution of the total rated power.

15. The method for identifying energy consumption of electrical appliances according to claim 5, wherein the string current controllers are more than one adjacent string current controllers which are connected to each other, each string current controller is connected to one or more strings of terminal controller string group, each string of terminal controller string group includes one or more terminal controllers and each terminal controller is connected to a group of electrical appliances.

16. The method for identifying energy consumption of electrical appliances according to claim 15, wherein the more than one string current controllers share a common power supply and coordinate the distribution of the total rated power.

17. The method for identifying energy consumption of electrical appliances according to claim 6, wherein the string current controllers are more than one adjacent string current controllers which are connected to each other, each string current controller is connected to one or more strings of terminal controller string group, each string of terminal controller string group includes one or more terminal controllers and each terminal controller is connected to a group of electrical appliances.

18. A system for identifying energy consumption of electrical appliances, comprising a string current controller, terminal controllers and a detector, the string current controller is connected to a power supply and the detector at the same time;

the string current controller is connected to one or more strings of terminal controller string group, wherein each string of terminal controller string group includes one or more terminal controllers connected in series according to priority and each terminal controller is connected to a group of electrical appliances;

the string current controller sends an identity authentication command to each string of terminal controller string group, every terminal controller in each string of terminal controller string group sequentially receives the identity authentication command in descending order of priority levels, and forwards the identity authentication command to a next-level terminal controller in turn, each terminal controller then reports an identity information by level from low to high according to the priority level, and eventually the string current controller receives the identity information;

the string current controller sends an action command to turn off all the terminal controllers, detects a current of the string current controller at this time, and defines and records a power at this time as a target power;

the string current controller sends an action command to turn on the terminal controller with the highest priority in the terminal controller string group and controls it to work with minimum power, detects a current of the string current controller at this time, and defines and records a power at this time as the lowest power of the terminal controller with the highest priority; the string current controller controls an operating power of the terminal controller with the highest priority to sequentially increase, and detects the current of the string current controller, and records the power until the string current controller is overloaded and/or the power of the terminal controller with the highest priority has reached the maximum power; above recorded power is added to a load power of the group of electrical appliances connected to the highest priority terminal controller to generate and record the total power at that time, if the total power value at this time is greater than the rated power of the string current controller, an alarm is issued, if the total power value at this time is less than the rated power of the string current controller, the string current controller sends an action command to turn on the terminal controller with the second priority in the terminal controller string group and controls it to work at the minimum power, above detection process is repeated until all the terminal controllers are turned on and have been detected.

19. The system for identifying energy consumption of electrical appliances according to claim 18, further comprising an antenna, the string current controller is connected to the antenna so as to connect the terminals via the network for remote control.

20. The system for identifying energy consumption of electrical appliances according to claim 18, wherein the string current controllers are more than one adjacent string current controllers which are connected to each other, each string current controller is connected to one or more strings of terminal controller string group, each string of terminal controller string group includes one or more terminal controllers and each terminal controller is connected to a group of electrical appliances.

* * * * *